United States Patent [19]

Bates

[11] Patent Number: 5,748,111
[45] Date of Patent: May 5, 1998

[54] APPARATUS FOR MONITORING THE SPEED AND AXIAL POSITION OF A ROTATING MEMBER

[75] Inventor: Kent C. Bates, Chillicothe, Ill.

[73] Assignee: Caterpillar Inc., Peoria, Ill.

[21] Appl. No.: 625,022

[22] Filed: Mar. 29, 1996

[51] Int. Cl.[6] .................................... H03M 1/22
[52] U.S. Cl. .................................... 341/11; 250/231.14
[58] Field of Search .................. 341/11, 13, 16, 341/17

[56] References Cited

U.S. PATENT DOCUMENTS

| | | | |
|---|---|---|---|
| 3,418,653 | 12/1968 | Robinson | 341/13 |
| 3,505,674 | 4/1970 | Hough | 341/16 |
| 3,524,067 | 8/1970 | West | 250/219 |
| 3,961,184 | 6/1976 | Schurrer | 250/231 |
| 4,103,155 | 7/1978 | Clark | 250/231 |
| 4,201,911 | 5/1980 | Dering | 250/231 |
| 4,641,027 | 2/1987 | Renner et al. | 250/237 |
| 4,746,791 | 5/1988 | Forkel | 250/231.14 |
| 4,879,555 | 11/1989 | Ichikawa et al. | 341/13 |
| 4,893,007 | 1/1990 | Stannow et al. | 250/231 |
| 4,987,299 | 1/1991 | Kobayashi et al. | 250/231.14 |
| 5,214,278 | 5/1993 | Banda | 250/231 |
| 5,253,531 | 10/1993 | Walker et al. | 73/650 |
| 5,264,844 | 11/1993 | Itou et al. | 341/11 |
| 5,266,796 | 11/1993 | Leviton | 250/231.18 |
| 5,350,955 | 9/1994 | Street | 307/515 |

*Primary Examiner*—Marc S. Hoff
*Attorney, Agent, or Firm*—Calvin E. Glastetter

[57] ABSTRACT

An apparatus for monitoring a rotating member. The apparatus includes a grating pattern having a plurality of wedge shaped pattern markings which are monitored by a sensor for generating a pulse signal. A processor calculates the rotating speed and the axial position of the rotating member as a function of the generated pulse signal.

7 Claims, 1 Drawing Sheet

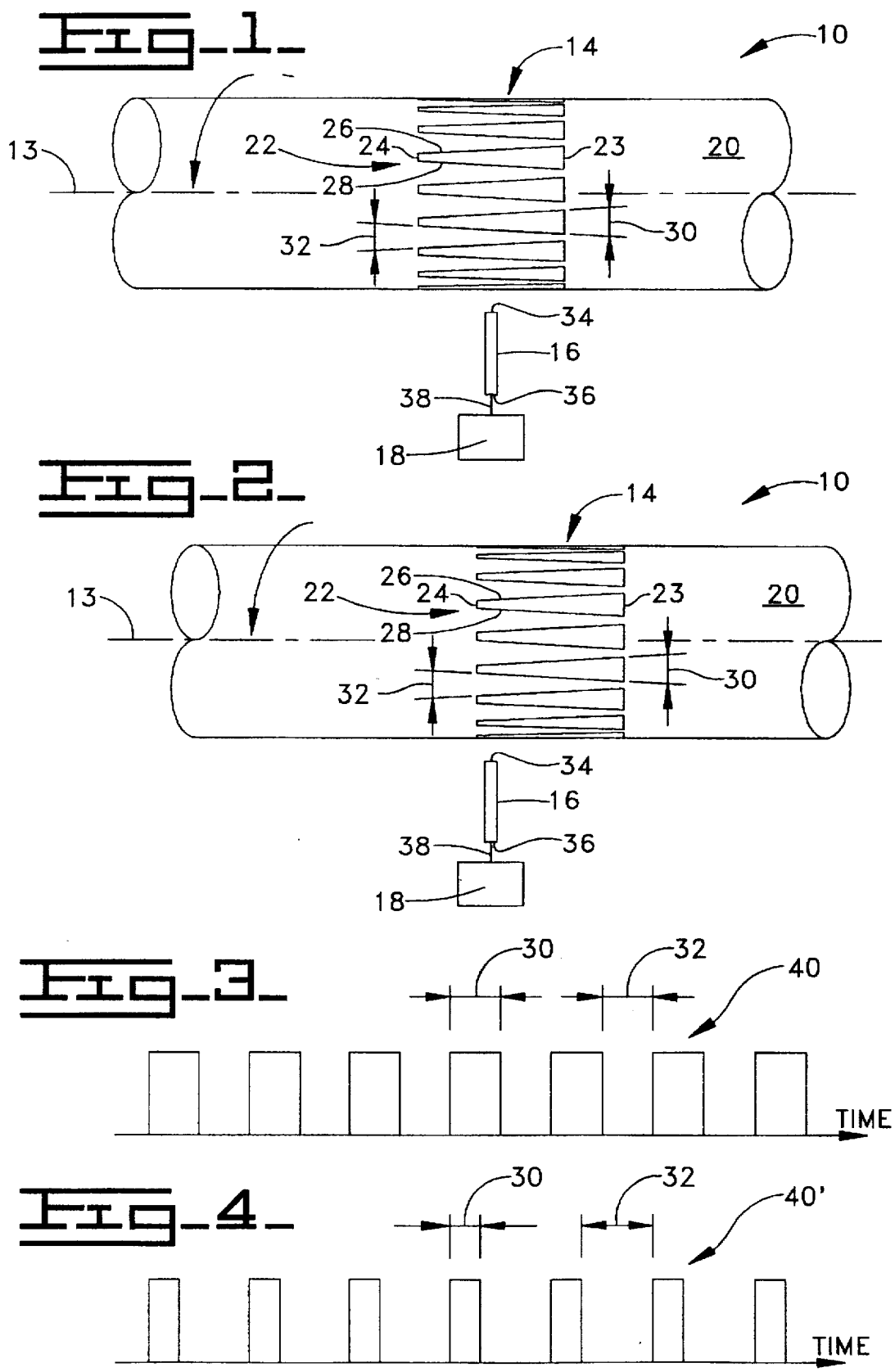

APPARATUS FOR MONITORING THE SPEED AND AXIAL POSITION OF A ROTATING MEMBER

TECHNICAL FILED

The present invention relates to an apparatus for monitoring a rotating member, and more particularly to monitoring the speed and axial position of the rotating member.

BACKGROUND ART

Devices for measuring speeds, in particular rotatory speeds of a rotating member wherein the speed is reproduced by a corresponding pulse frequency are known. Devices for measuring the axial position of members are also known. However, one apparatus was needed to measure rotatory speeds and a second apparatus was needed for measuring the axial position. Using different apparatus required a duplication of components which added cost and complexity to the necessary structure.

The present invention is directed to overcoming one or more of these problems.

DISCLOSURE OF THE INVENTION

In one aspect of the present invention, an apparatus for monitoring the speed and position of a rotating member includes a grating pattern on a peripheral surface of the rotating member. A sensor is positioned to detect the grating pattern on the rotating member. A processor operatively connected to the sensor is provided for calculating the speed and axial position of the rotating member.

The present invention provides an apparatus for monitoring both the rotatory speed and the axial position of the rotating member.

BRIEF DESCRIPTION OF THE DRAWINGS

FIG. 1 is a diagrammatic view of the apparatus of the present invention;

FIG. 2 is a diagrammatic view of the present apparatus showing the rotating member moved rightward;

FIG. 3 is a diagrammatic representation of a pulse signal with the sensor reading one position on the rotating member as shown in FIG. 1; and FIG. 4 is a diagrammatic representation of the pulse signal with the sensor reading a second position on the rotating member as shown in FIG. 2.

BEST MODE FOR CARRYING OUT THE INVENTION

Referring to the drawings, and in particular FIG. 1 and 2, an apparatus 10 is provided for monitoring the rotating speed and axial position of a rotating member 12, such as a shaft having a central axis 13. The rotating member is shown as a shaft, however any type of rotatory device could be used without departing from the scope of the invention. The apparatus 10 includes a grating pattern 14, a sensor 16 and a processor 18.

The grating pattern 14 is formed on a peripheral surface 20 of the rotatory member 12. The grating pattern could be directly formed on the peripheral surface, such as being etched or machined into the surface or could be attached to the surface as in the form of a decal. The decal could be made of a Mylar material, a metal material or a plastic material and would still be covered within the scope of the invention. The grating pattern 14 includes a plurality of wedge shaped pattern marking 22 that are equally spaced around the peripheral surface 20 of the rotating member 12. The pattern markings 22 extend longitudinally with the axis 13 of the rotating member 12. Each marking of the plurality of pattern marking 22 has a first end portion 23, a second end portion 24, a first tapered side 26 and a second tapered side 28. The tapered sides 26, 28 converge from the first end portion 23 toward the second end portion 24. Each marking has a predetermined width 30, which corresponds to a predetermined longitudinal spacing, between the tapered sides 26, 28. The equally spaced pattern markings 22 have a predetermined space 32, which also corresponds to the predetermined longitudinal spacing, between each adjacent marking.

The sensor 16 has a first end portion 34 and a second end portion 36. The first end portion 34 is positioned adjacent the grating pattern 14 to monitor and detect the pattern markings 22 width 30 and the spacing 32 between adjacent pattern markings 22. If the rotating member 12 axially moves to the right, as viewed in FIG. 2, the sensor would monitor a different portion of the pattern markings 22. The sensor 16 could be any type of sensor which will monitor and detect the pattern markings 22 and the type of sensor does not limit the scope of the invention.

The processor 18 is connected to the second end portion 36 of the sensor 16 by an electrical cable 38. The processor 18 receives the input from the sensor 16 and generates a pulse signal 40, 40', as shown in FIGS. 3 and 4, relative to the with 30 of the marking 22 and the spacing 32 between adjacent markings 22 and calculates the rotating speed and axial position of the rotating member 12 based on the pulse signal 40. The processor 18 contains a look-up table to which the pulse signal 40 is compared for calculating the speed and axial position, as is known in the art.

Referring to FIG. 3, the pulse signal 40 is shown as being generated by the sensor 16 when reading the portion of the pattern marking as shown in FIG. 1. The width 30 of the markings 22 and the spacing 32 between adjacent marking 22 is shown as being approximately the same and are used by the processor to calculate the rotating speed and axial position of the rotating member 12.

Referring to FIG. 4, the pulse signal 40' is shown as being generated by the sensor 16 when reading a second portion of the pattern marking with the rotating member moved rightward as shown in FIG. 2. The width 30 of the marking 22 is shown as being smaller and the spacing 32 between adjacent markings 22 is shown as being larger as compared to the pulse signal 40 of FIG. 3.

Industrial Applicability

In the operation of the monitoring apparatus 10 the rotating member 12 and the grating pattern 14 is rotating around the central axis 13. The sensor 16 will detect the width 30 of the wedge shaped pattern marking 22 and the spacing 32 between adjacent pattern markings 22. The pulse signal 40 will be generated based on the detected width and spacing of the pattern markings 22. The processor 18 calculates the speed and axial position of the rotating member 12 based on the pulse signal 40. If the readings change the processor can determine that the shaft has moved axially.

In view of the forgoing, it is readily apparent that the structure of the present invention provides an apparatus that will monitor and detect the rotational speed and axial position of a rotating member.

Other aspects, objects and advantages of this invention can be obtained from a study of the drawing, the disclosure and the appended claims.

I claim:

1. An apparatus for monitoring the speed and position of a rotating member, the apparatus comprising:
   a grating pattern on a peripheral surface portion of the rotating member;
   a sensor positioned for detecting the grating pattern on the rotating member; and
   a processor operatively connected to the sensor for calculating the speed and axial position of the rotating member.

2. The apparatus for monitoring, as set forth in claim 1, wherein the grating pattern includes a plurality of pattern markings equally spaced around the peripheral surface of the rotating member, the pattern markings are wedge shaped and extend longitudinally with respect to the rotating member.

3. The apparatus for monitoring, as set forth in claim 2, wherein the sensor has an end positioned adjacent the grating pattern to detect the width of the wedge shaped markings and to detect the spacing between adjacent markings.

4. The apparatus for monitoring, as set forth in claim 3, wherein a single sensor is used to detect the width of the wedge shaped markings and to detect the spacing between adjacent markings.

5. The apparatus for monitoring, as set forth in claim 3, wherein the processor reads the detected signal of the width of the wedge shaped markings and the spacing between the adjacent markings and generates a pulse signal which is used to calculate the speed and axial position of the rotating member.

6. A method for detecting the speed and axial position of a rotating member comprising the steps of:
   monitoring the rotation and position of a plurality of grating pattern markings on the rotating member;
   detecting the width of the markings and the spacing between the adjacent markings;
   generating a pulse signal relative to the detected width of the markings and the spacing between the adjacent markings; and
   calculating the speed and axial position of the rotating member based on the generated pulse signal.

7. An apparatus for monitoring the speed and position of a rotating member, the apparatus comprising:
   a grating pattern on a peripheral surface portion of the rotating member, the grating pattern includes a plurality of longitudinally extending wedge shaped pattern markings equally spaced around the peripheral surface of the rotating member;
   a sensor positioned for detecting the grating pattern on the rotating member, the sensor detects the width of the pattern markings and the spacing between adjacent pattern markings; and
   a processor operatively connected to the sensor for receiving the detected width and spacing of the pattern and calculates a speed and axial position of the rotating member relative to the position of the sensor.

* * * * *